US008169783B2

(12) United States Patent
Phillips et al.

(10) Patent No.: US 8,169,783 B2
(45) Date of Patent: May 1, 2012

(54) LATCH ASSEMBLY FOR A PLUGGABLE ELECTRONIC MODULE

(75) Inventors: Michael J. Phillips, Camp Hill, PA (US); Michael E. Cowher, Harrisburg, PA (US); Matthew David Morrison, Duncannon, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 477 days.

(21) Appl. No.: 12/414,158

(22) Filed: Mar. 30, 2009

(65) Prior Publication Data

US 2010/0246142 A1 Sep. 30, 2010

(51) Int. Cl.
*H05K 7/00* (2006.01)

(52) U.S. Cl. ........................................ 361/728; 361/747

(58) Field of Classification Search .................. 361/801, 361/802, 803, 686, 785
See application file for complete search history.

(56) References Cited

U.S. PATENT DOCUMENTS

| | | | | |
|---|---|---|---|---|
| 3,575,685 | A * | 4/1971 | Gley | 439/157 |
| 3,694,015 | A * | 9/1972 | Gley | 292/80 |
| 4,597,689 | A * | 7/1986 | Mitchell et al. | 403/322.3 |
| 5,577,782 | A * | 11/1996 | Johnson et al. | 292/216 |
| 5,984,384 | A * | 11/1999 | Hamaguchi et al. | 292/216 |
| 6,009,732 | A * | 1/2000 | Haeck et al. | 70/92 |
| 6,042,159 | A * | 3/2000 | Spitzley et al. | 292/216 |
| 6,149,451 | A * | 11/2000 | Weber | 439/358 |
| 6,276,076 | B1 * | 8/2001 | Quenzi et al. | 37/231 |
| 6,431,887 | B1 * | 8/2002 | Yeomans et al. | 439/108 |
| 6,786,070 | B1 * | 9/2004 | Dimig et al. | 70/277 |
| 6,805,573 | B2 * | 10/2004 | Phillips et al. | 439/352 |
| 6,851,696 | B1 * | 2/2005 | Hensley | 280/455.1 |
| 7,040,674 | B2 * | 5/2006 | Lomicka et al. | 292/201 |
| 7,090,523 | B2 * | 8/2006 | Shirk et al. | 439/352 |
| 7,114,984 | B2 | 10/2006 | Shirk et al. | |
| 7,507,103 | B1 * | 3/2009 | Phillips et al. | 439/352 |
| 7,699,641 | B2 * | 4/2010 | Bright et al. | 439/352 |
| 7,857,344 | B2 * | 12/2010 | Hensley | 280/455.1 |
| 7,905,222 | B1 * | 3/2011 | Fenley | 124/16 |
| 2002/0146926 | A1 * | 10/2002 | Fogg et al. | 439/362 |
| 2003/0063454 | A1 * | 4/2003 | Wilson et al. | 361/796 |
| 2003/0171016 | A1 * | 9/2003 | Bright et al. | 439/160 |
| 2005/0095915 | A1 * | 5/2005 | Oleynick et al. | 439/607 |
| 2008/0171469 | A1 * | 7/2008 | Phillips | 439/607 |

* cited by examiner

*Primary Examiner* — Jinhee Lee
*Assistant Examiner* — Xanthia C Cunningham

(57) ABSTRACT

A latch assembly for a pluggable electronic module matable with a receptacle assembly includes a lever actuatable between a latched position and an unlatched position, a yoke assembly operatively coupled to the lever, and a latch element coupled to the latch end of the yoke assembly. The yoke assembly has a latch end rotatable between a latched position and an unlatched position. The latch element is movable between an engaged position and an unengaged position as the latch end is rotated between the latched and unlatched positions, respectively. The latch element is configured to engage the receptacle assembly to lock the pluggable electronic module within the receptacle assembly when the latch element is in the engaged position.

21 Claims, 8 Drawing Sheets

LATCH ASSEMBLY FOR A PLUGGABLE ELECTRONIC MODULE

BACKGROUND OF THE INVENTION

The subject matter herein relates generally to pluggable electronic modules, and more particularly to a latch assembly for a pluggable electronic module.

Various types of fiber optic and copper based transceivers that permit communication between electronic host equipment and external devices are known. These transceivers may be incorporated into electronic modules that can be pluggably connected to the host equipment to provide flexibility in system configuration. The pluggable electronic modules are constructed according to various standards for size and compatibility, one standard being the Small Form-factor Pluggable (SFP) module standard.

SFP modules are plugged into a receptacle that is mounted on a circuit board within the host equipment. The receptacle includes an elongated guide frame, or cage, having a front that is open to an interior space, and an electrical connector disposed at a rear of the guide frame within the interior space. Both the connector and the guide frame are electrically and mechanically connected to the circuit board, and when an SFP module is plugged into the receptacle it is electrically and mechanically connected to the circuit board as well.

SFP modules typically include a latch assembly that cooperates with a latch element on the guide frame to latch the SFP module to the receptacle. At least some known latch assemblies of SFP modules include a pin that is received within a triangular opening of the latch element of the guide frame. However, the latch assemblies of conventional SFP modules may have complicated actuating mechanisms and/or may take up more space than is desired within a housing of the SFP module. For example, some known latch assemblies include a lever that is pushed inward toward the latch element of the guide frame. The lever includes a wedge at the end of the lever that moves the latch element to release the pin. Other known latch assemblies include a rotatable lever that is actuated to move a slide toward the latch element of the guide frame. The slide may have a wedge at the end of the slide that moves the latch element to release the pin. Such latch assemblies that engage the latch element may cause damage to the latch element of the guide frame. For example, such latch assemblies may bend the latch element such that the pin no longer locks within the opening of the latch element. Additionally, such latch assemblies may be bulky and increase the overall size of the SFP module. For example, the slide or the lever may extend outward from the housing of the SFP module. Furthermore, such latch assemblies that include the rotatable lever that moves the slide are complicated and costly to assemble and manufacture.

There is a need for a latch assembly that has a less complicated actuating mechanism and/or that takes up less space within a housing of the electronic module.

BRIEF DESCRIPTION OF THE INVENTION

In one embodiment, a latch assembly is provided for a pluggable electronic module matable with a receptacle assembly. The latch assembly includes a lever actuatable between a latched position and an unlatched position, a yoke assembly operatively coupled to the lever, and a latch element coupled to the latch end of the yoke assembly. The yoke assembly has a latch end rotatable between a latched position and an unlatched position. The latch element is movable between an engaged position and an unengaged position as the latch end is rotated between the latched and unlatched positions, respectively. The latch element is configured to engage the receptacle assembly to lock the pluggable electronic module within the receptacle assembly when the latch element is in the engaged position.

Optionally, the yoke assembly may be either fixedly coupled to the lever or integrally formed with the lever. The latch element may be movable in a linear direction and the latch end may be rotatable with respect to the latch element. The yoke assembly may include a yoke body coupled to the lever and the yoke assembly may include a yoke insert coupled to the yoke body. The yoke insert may extend from the yoke body to the latch end to engage the latch element. The yoke body may be manufactured from a dielectric material and the yoke insert may be manufactured from a metal material.

In another embodiment, a pluggable electronic module is provided that includes a housing configured to be received within a receptacle assembly, an electronic component held by the housing and configured to be mated with a connector of the receptacle assembly, and a latch assembly configured to lock the housing within the receptacle assembly. The latch assembly includes a lever movably coupled to the housing and a yoke assembly operatively coupled to the lever. The lever and yoke assembly are rotatable between latched and unlatched positions. The latch assembly further includes a latch element coupled to the yoke assembly, where the latch element is movable between an engaged position and an unengaged position as the yoke assembly is rotated between the latched and unlatched positions, respectively. The latch element is configured to lock the housing within the receptacle assembly when in the engaged position.

In a further embodiment, a pluggable electronic module is provided that includes a housing configured to be received within a receptacle assembly, an electronic component held by the housing and configured to be mated with a connector of the receptacle assembly, and a latch assembly configured to lock the housing within the receptacle assembly. The latch assembly includes a lever movably coupled to the housing and a yoke assembly operatively coupled to the lever. The latch assembly also includes a latch element coupled to the yoke assembly and a return spring engaging the latch element. The latch element is movable between an engaged position and an unengaged position. The yoke assembly forces the latch element to the unengaged position when the lever is actuated and the return spring forces the latch element to the engaged position when the lever is released.

DETAILED DESCRIPTION OF THE INVENTION

Figure 1:
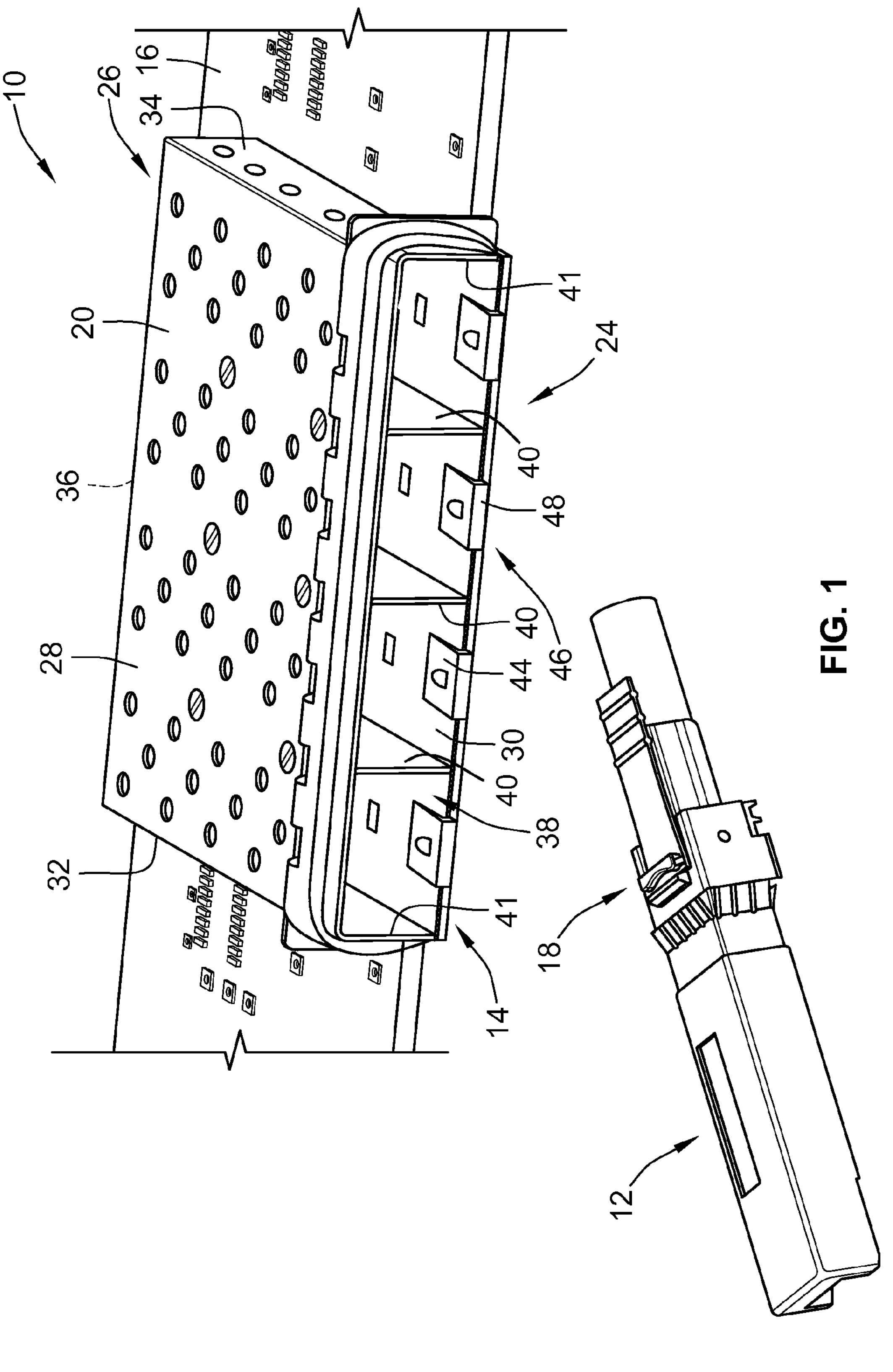
FIG. 1 is a partially exploded perspective view of an exemplary embodiment of an electrical connector system.

FIG. 1 is a partially exploded perspective view of an exemplary embodiment of an electrical connector system 10. The system 10 includes a plurality of pluggable electronic modules 12 (only one is shown in FIG. 1) configured to be plugged into a receptacle assembly 14 that is mounted to a host circuit board 16. As will be described below, the pluggable electronic module 12 includes a latch assembly 18 for latching the pluggable electronic module 12 to the receptacle assembly 14.

The receptacle assembly 14 includes a guide frame 20 having a plurality of electrical connectors 22 (shown in FIG. 2) positioned therein. The receptacle assembly 14 is positioned on the circuit board 16 for electrically connecting a plurality of the pluggable electronic modules 12 to the circuit board 16 via the electrical connectors 22. A plug end portion 24 of the guide frame 20, through which the pluggable electronic modules 12 are installed into the receptacle assembly 14, is configured to be mounted, or received, within an opening of a panel (not shown) that is adjacent the circuit board 16. For example, the panel may be a wall of a housing of a device (not shown), such as, but not limited to, a computer, that includes the circuit board 16. In such an example, the receptacle assembly 14 enables pluggable electronic modules 12 located outside the housing to be electrically connected to the circuit board 16 contained within the housing.

The guide frame 20 extends between the plug end portion 24 and an opposite rear end portion 26. In the illustrated embodiment, the guide frame 20 includes a generally rectangular cross section, for example taken along line 1-1 of FIG. 1, and includes an upper wall 28, a lower wall 30, side walls 32 and 34, and a rear wall 36. However, the guide frame 20 may include any suitable cross-sectional shape that enables the guide frame 20 to function as described herein. The guide frame 20 may have an open bottom wherein the circuit board 16 defines the lower wall 30.

The guide frame 20 includes an internal chamber that is subdivided into a plurality of internal compartments 38, which are arranged in a row. Specifically, in the illustrated embodiment, the guide frame 20 includes three divider walls 40 that divide the internal chamber into four internal compartments 38. Each internal compartment 38 is configured to receive a pluggable electronic module 12 therein through a corresponding opening, or port, 41 at the plug end portion 24 that communicates with the corresponding internal compartment 38. For each internal compartment 38, the guide frame 20 also includes an opening (not shown) extending through the lower wall 30. The openings within the lower wall 30 are adjacent the rear end portion 26 of the guide frame 20 for receiving a corresponding one of the electrical connectors 22 within the corresponding internal compartment 38 of the guide frame 20. The openings within the lower wall 30 of the guide frame 20 also enable electrical connection between the electrical connectors 22 and the circuit board 16. Specifically, when the guide frame 20 is mounted on the circuit board 16 and the electrical connectors 22 are positioned within the corresponding internal compartments 38, each electrical connector 22 is electrically connected to the circuit board 16. When the pluggable electronic modules 12 are plugged into the corresponding internal compartments 38, each pluggable electronic module 12 is plugged into and electrically connected to a corresponding electrical connector 22, thereby interconnecting the pluggable electronic modules 12 to the circuit board 16.

Although the guide frame 20 is shown as including four internal compartments 38 arranged in a single row, the guide frame 20 may include any number of internal compartments 38, arranged in any number of rows and/or columns, for receiving any number of pluggable electronic modules 12. In some embodiments, the guide frame 20 includes only one internal compartment 38 for receiving only one pluggable electronic module 12.

Each of the internal compartments 38 includes a latch element 42 on the lower wall 30 of the guide frame 20 adjacent the plug end portion 24 for cooperating with the latch assembly 18 of the corresponding pluggable electronic module 12. The latch elements 42 may each have any suitable shape and each include any suitable structure that enables the latch elements 42 to interface with the latch assembly 18 in a latching operation to secure the pluggable electronic module 12 to the guide frame 20. In the illustrated embodiment, each latch element 42 includes an extension 44 having an opening 46 therein that interfaces with the latch assembly 18. The openings 46 may have any suitable size and/or shape that enables the opening 46 to function as described herein. Although the latch elements 42 are each located on the lower wall 30 of the guide frame 20, the latch elements 42 may be located on any of the walls 28, 30, 32, and/or 34, and/or the internal dividers 40. Optionally, the extension 44 may also ground the pluggable electronic module 12 to the guide frame 20. The latch elements 42 may extend forward of the front edge of the circuit board 16. The latch elements 42 may be deflectable. The latch elements 42 may include ramp surfaces 48 forward of the openings 46. The ramp surfaces 48 may be angled or curved.

Figure 2:
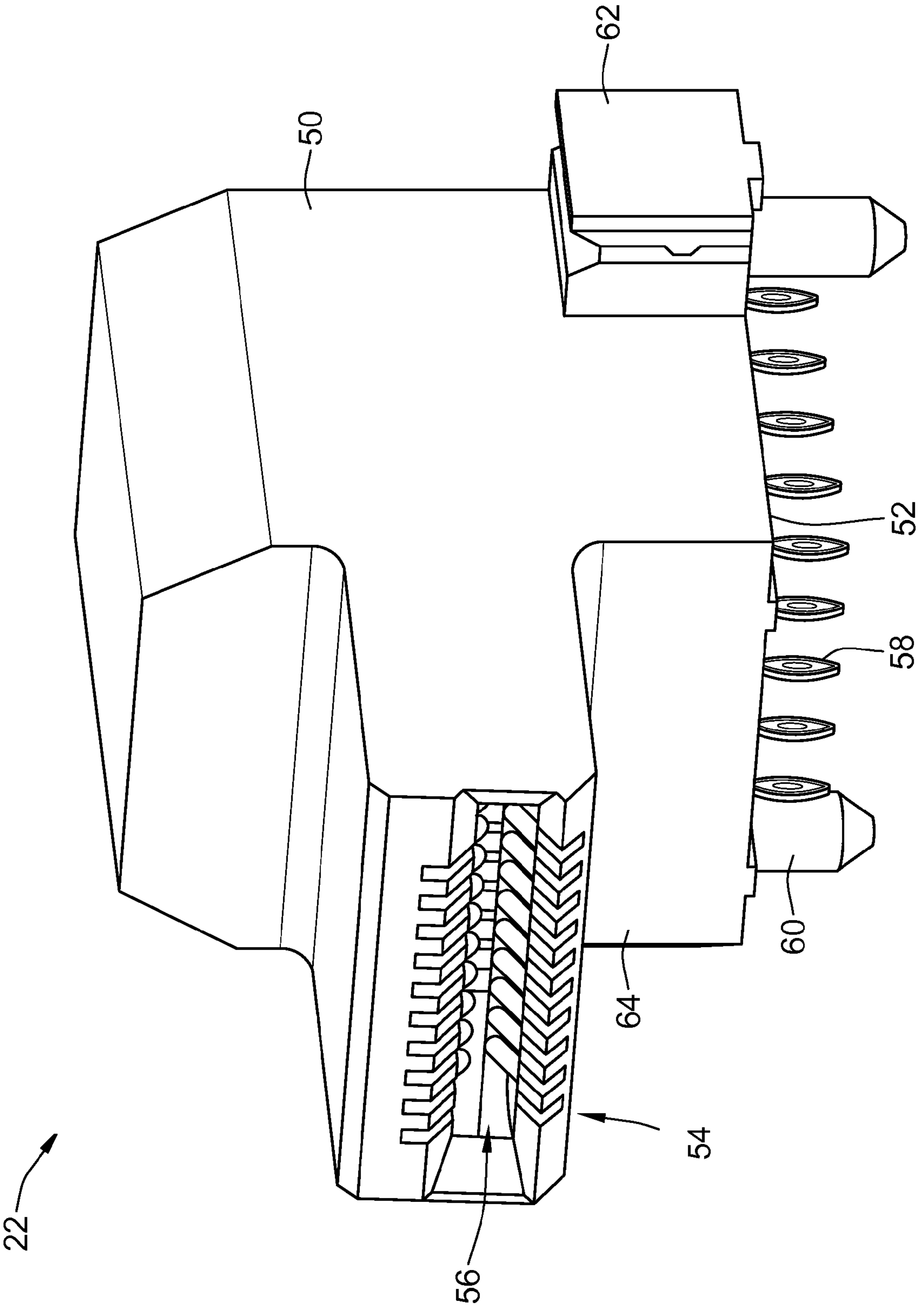
FIG. 2 is a perspective view of an exemplary embodiment of an electrical connector of the system shown in FIG. 1.

FIG. 2 is a perspective view of an exemplary embodiment of one of the electrical connectors 22. The electrical connector 22 includes a housing 50 having a lower face 52 for mating with the circuit board 16 (shown in FIG. 1) and a mating face 54 for engagement with the pluggable electronic module 12. Specifically, the mating face 54 includes a terminal receptacle 56 that receives a portion of the pluggable electronic module 12. The terminal receptacle 56 includes one or more electrical contacts 58, only the contact tails of which are illustrated in FIG. 2, that may be electrically connected to the circuit board 16. The electrical contacts 58 are also exposed within the terminal receptacle for mating with the pluggable electronic module 12. The electrical contacts 58 may each be any suitable type of electrical contact. The housing 50 may include alignment posts 60 and mounting lugs 62 for aligning the electrical connector 22 within the guide frame 20 (FIG. 1) and securing the electrical connector 22 in place within the guide frame 20, respectively.

Figure 3:
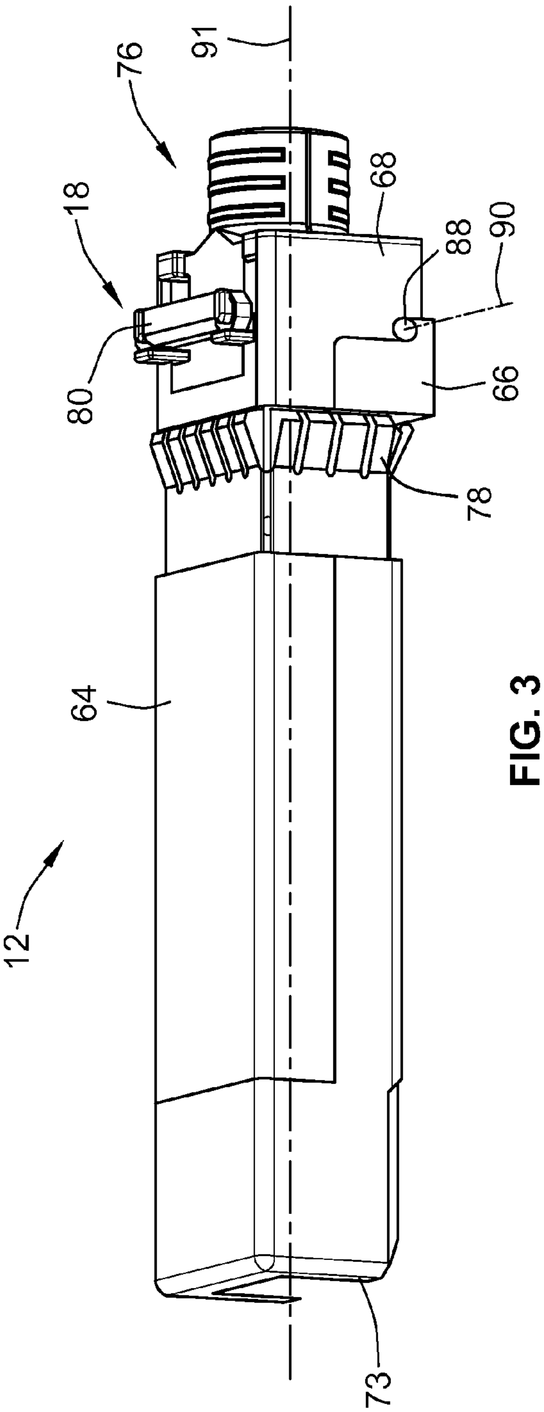
FIG. 3 is a top perspective view of an exemplary embodiment of a pluggable electronic-module of the system shown in FIG. 1.
Figure 4:
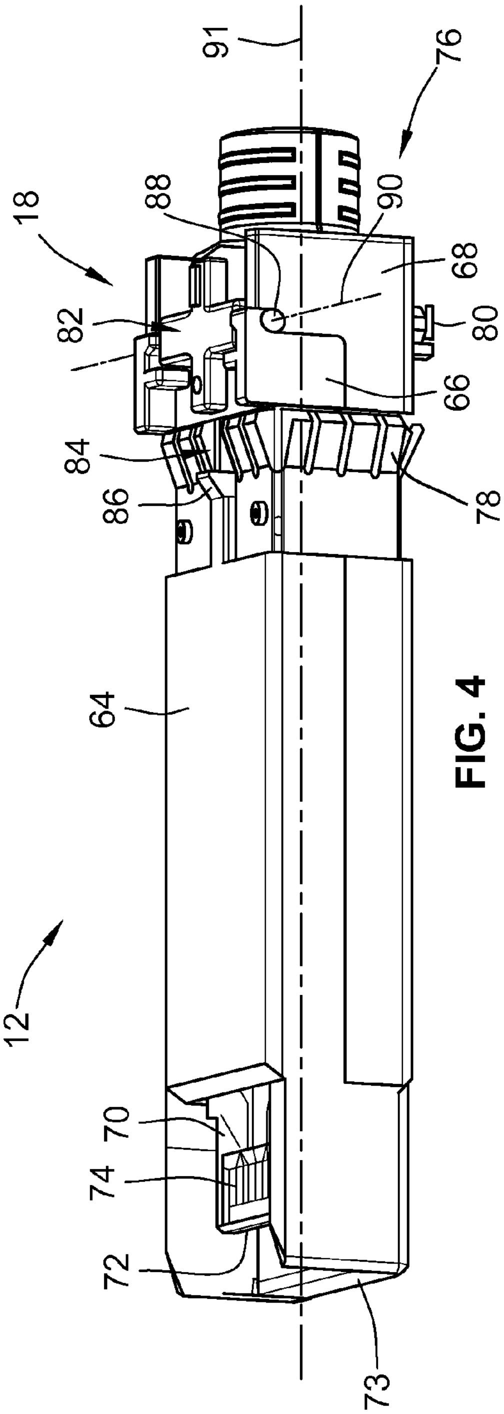
FIG. 4 is a bottom perspective view of the pluggable electronic module shown in FIG. 3.

FIGS. 3 and 4 are top and bottom perspective views, respectively, of an exemplary embodiment of the pluggable electronic module 12. The pluggable electronic module 12 may be any suitable type of pluggable electrical component, such as, but not limited to, small form-factor pluggable (SFP) modules (including, but not limited to, XFP and QSFP modules), that may be received within a receptacle assembly, such as, but not limited to, the receptacle assembly 14 (shown in FIG. 1).

The pluggable electronic module 12 includes a housing 64 having a base or lower shell 66 and a cover or upper shell 68 that are secured together to form a protective shell for an electronic component, such as a circuit board 70 or contacts, that is disposed within an interior cavity of the housing 64. The circuit board 70 may, in some embodiments, carry electronic circuitry and devices that perform transceiver functions. An edge portion 72 of the circuit board 70 is exposed through a plug end portion 73 of the pluggable electronic module 12. During mating, the pluggable electronic module 12 is plugged into the corresponding port 41 (shown FIG. 1) of the receptacle assembly 14 and the circuit board 70 is plugged into the terminal receptacle 56 (shown in FIG. 2) of the corresponding electrical connector 22 (shown in FIG. 2). Specifically, when the pluggable electronic module 12 is fully plugged into the corresponding port 41 of the receptacle assembly guide frame 20, electrical contacts 74 on the circuit board 70 are electrically connected to the corresponding electrical contacts within the corresponding terminal receptacle 56. As such, the pluggable electronic module 12 can be electrically connected to the circuit board 16 (shown in FIG. 1) via the corresponding electrical connector 22 disposed within the guide frame 20. The electrical contacts 74 may each be any suitable type of electrical contact.

When the pluggable electronic module 12 is fully plugged into the receptacle assembly 14, a front end portion 76 of the pluggable electronic module 12 extends from the receptacle assembly 14 at the plug end portion 24 thereof. The front end portion 76 of the pluggable electronic module 12 includes a connector interface that is joined to an optical fiber cable or a copper wire electrical cable. Alternatively, the front end portion 76 may include a connector port that receives a communication plug therein, such as, but not limited to, a fiber optic connector or a modular plug.

The pluggable electronic module 12 may include features that ground the pluggable electronic module 12 to the guide frame 20. For example, in an exemplary embodiment, the pluggable electronic module 12 includes a metallic spring gasket 78 that surrounds a portion of the housing 64 and engages the guide frame 20 when the pluggable electronic module 12 is plugged into the receptacle assembly 14. The spring gasket 78 may also facilitate containing electromagnetic interference (EMI) emissions.

As described above, the pluggable electronic module 12 includes the latch assembly 18 for latching the pluggable electronic module 12 to the receptacle assembly 14, and more specifically to the corresponding latch element 42 (shown in FIG. 1) of the guide frame 20. The latch assembly 18 includes a lever 80 and a yoke assembly 82 operatively coupled to the lever 80. The yoke assembly 82 has a latch end 84. The latch assembly 18 also includes a latch element 86 coupled to the latch end 84 of the yoke assembly 82.

In an exemplary embodiment, the lever 80 and the yoke assembly 82 are rotatable between latched positions and unlatched positions. A rotator pin 88 extends from the lever 80 and/or yoke assembly 82. The lever 80 and/or yoke assembly 82 are rotated about a pivot axis 90 defined along the rotator pin 88. In the illustrated embodiment, the rotator pin 88 is captured between the lower shell 66 and the upper shell 68. Alternatively, the rotator pin 88 may be held within the lower shell 66 or the upper shell 68. The latch element 86 is movable between an engaged position and an unengaged position as the latch end 84 of the yoke assembly 82 is moved between the latched and unlatched positions. The latch element 86 is configured to engage the latch element 42 of the receptacle assembly 14 to lock the pluggable electronic module 12 within the receptacle assembly when the latch element 86 is in the engaged position.

Figure 5:
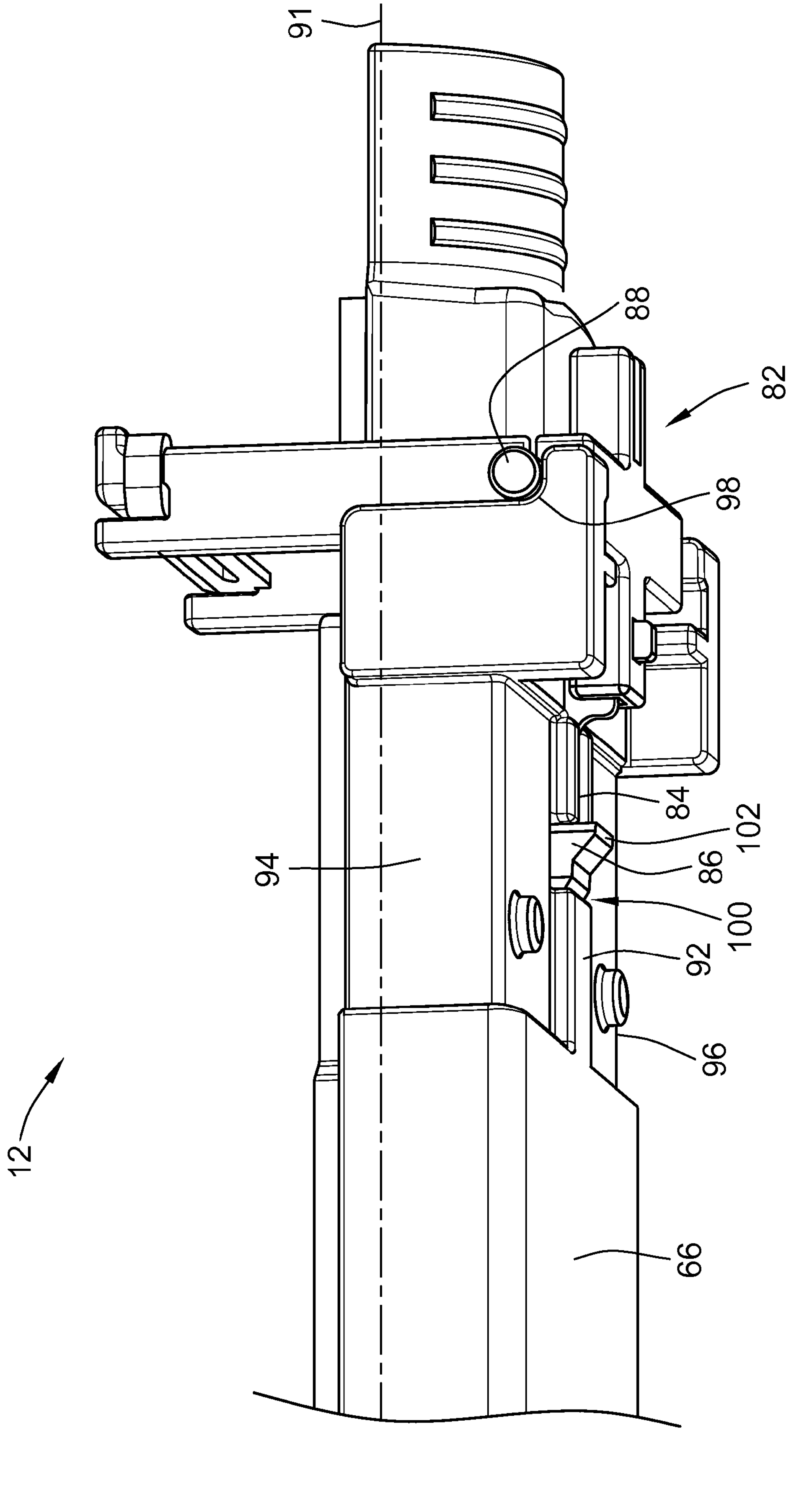
FIG. 5 is another bottom perspective view of the pluggable electronic module shown in FIG. 3 with an upper shell of the pluggable electronic module removed.

FIG. 5 is another bottom perspective view of the pluggable electronic module 12 with the upper shell 68 of the pluggable electronic module 12 removed. The lower shell 66 extends longitudinally along a housing axis 91. The lower shell 66 includes a bottom 92 and sidewalls 94, 96 that extend generally parallel to the housing axis 91. The lower shell 66 includes a shoulder 98 that supports the rotator pin 88. The yoke assembly 82 extends along the bottom 92 and is fixed in position relative to the lower shell 66 by the engagement of the rotator pin 88 with the shoulder 98. As such, the longitudinal position of the yoke assembly 82 is fixed relative to the housing axis 91. However, the yoke assembly 82 is rotatable about the rotator pin 88.

The latch element 86 is positioned within a channel 100 formed in the lower shell 66. The channel 100 extends generally perpendicular to the bottom 92. A latching end 102 of the latch element 86 extends from the channel 100 beyond the bottom 92. The latch end 84 of the yoke assembly 82 engages the latch element 86. As the yoke assembly 82 is rotated, the latching end 102 is lifted into the channel 100 such that the latching end 102 is aligned with or is positioned above the bottom 92.

Figure 6:
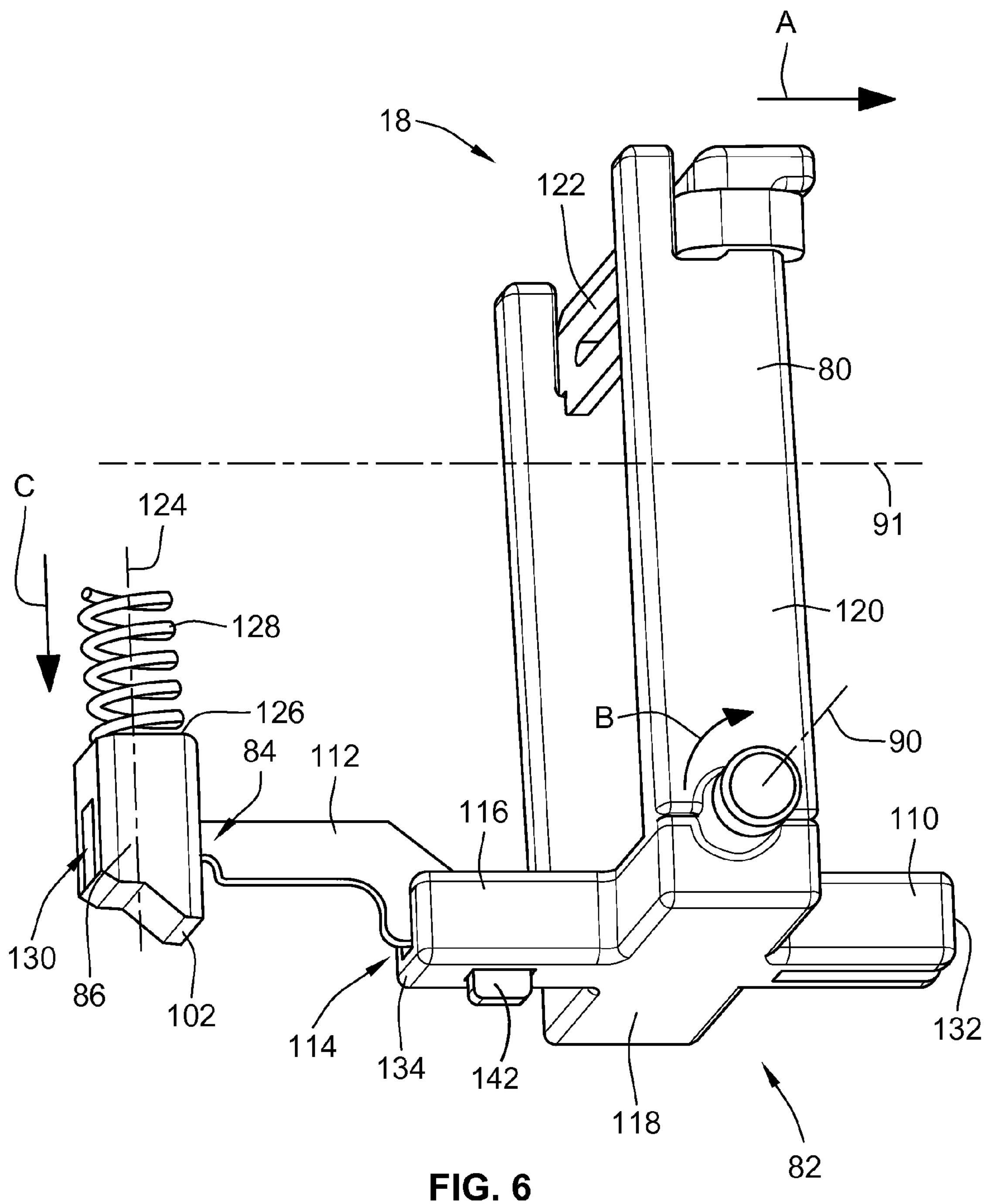
FIG. 6 illustrates a latch assembly for the pluggable electronic module shown in FIG. 3.

FIG. 6 illustrates the latch assembly 18 for the pluggable electronic module 12. The yoke assembly 82 includes a yoke body 110 and a yoke insert 112. The yoke insert 112 is coupled to the yoke body 110. For example, the yoke insert 112 may be received within a slot 114 formed in the yoke body 110. The yoke insert 112 extends rearward from the yoke body 110 to the latch end 84 to engage the latch element 86. The yoke body 110 may be manufactured from a dielectric material, such as a plastic material. Alternatively, the yoke body 110 may be manufactured from other materials, such as a metal material. The yoke insert 112 may be manufactured from a metal material or a plastic material. In one embodiment, the yoke insert 112 is a stamped component from a metal blank.

The lever 80 extends from the yoke body 110. Optionally, the lever 80 may be integrally formed with the yoke body 110. Alternatively, the lever 80 may be separate from, and coupled to, the yoke body 110. The yoke body 110 includes a central beam 116 and wings 118 extending from the beam in opposite directions. The central beam 116 extends generally parallel to the housing axis 91. The wings 118 extend generally perpendicular to the housing axis 91.

The lever 80 includes a pair of arms 120 and a handle 122 extending between the arms 120 at a top of the arms 120. The arms 120 extend from outer edges of corresponding wings 118. The lever 80 extends perpendicular to the housing axis 91.

The latch element 86 extends along a latch axis 124 between a spring end 126 and the latching end 102. The latch axis 124 is oriented generally perpendicular to the housing axis 91. The latch element 86 is movable in a direction parallel to the latch axis 124.

The latch assembly 18 includes a return spring 128. The return spring 128 is biased against the spring end 126 of the latch element 86 and generally forces the latch element 86 outward. In the illustrated embodiment the return spring 128 is represented by a coil spring, however other types of biasing mechanisms may be used to force the latch element 86 outward.

In an exemplary embodiment, the latch element 86 includes a slot 130 extending along the latch axis 124. The slot 130 may extend completely through the latch element 86. Alternatively, the slot 130 may extend only partially through a latch element 86. A portion of the yoke assembly 82 is received within the slot 130. In the illustrated embodiment, the latch end 84 of the yoke insert 112 is received within the slot 130.

In operation, the lever handle 122 is actuated from a latched position to an unlatched position. For example, the handle 122 is pulled forward, such as in the direction of arrow A. As the handle 122 is pulled forward, the lever 80 and yoke assembly 82 are rotated about the pivot axis 90. For example, the lever 80 and yoke assembly 82 are rotated in the direction of arrow B. A front end 132 of the yoke body 110 is pivoted away from the bottom 92 (shown in FIG. 5) and a rear end 134 of the yoke body 110 is pivoted toward the bottom 92. Similarly, the latch end 84 of the yoke insert 112 is pivoted upward. As the latch end 84 is pivoted upward, the latch element 86 is simultaneously forced upward by the yoke insert 112. The return spring 128 is compressed as the latch element 86 is forced upward. The return spring 128 provides a spring force in a return direction, shown by the arrow C. When the handle 122 is released, the return spring 128 forces the latch element 86 downward. The latch element 86 simultaneously forces the yoke insert 112 and yoke body 110 to rotate in the opposite direction.

Figure 7:
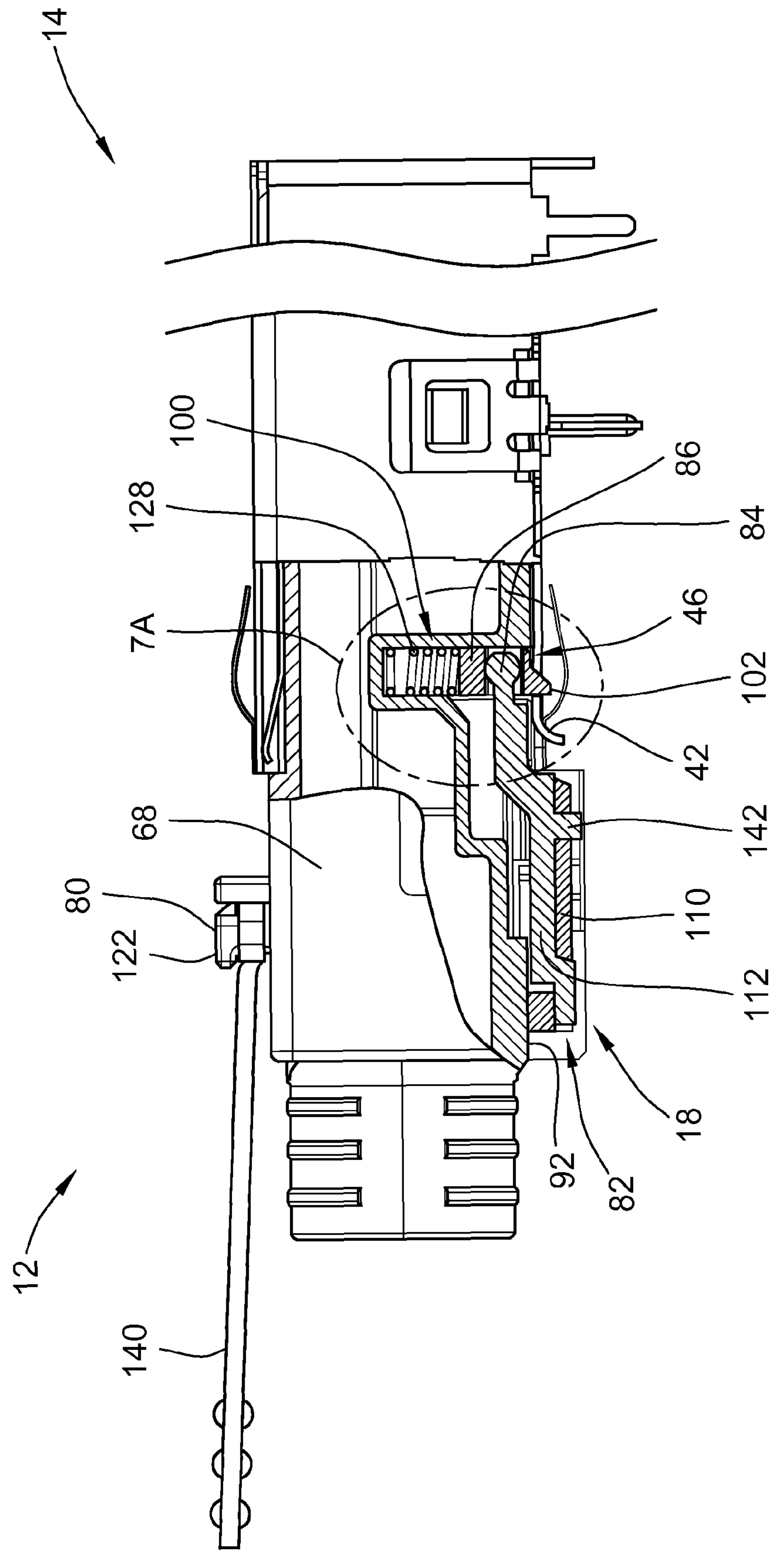
FIG. 7 is a partial sectional view of the pluggable electronic module with the latch assembly in a mated state.

FIG. 7 is a partial sectional view of the pluggable electronic module 12 with the latch assembly 18 in a mated state. In the mated state, the pluggable electronic module 12 is received within the receptacle assembly 14. The latch assembly 18 engages the latch element 42 of the receptacle assembly 14 in a locking manner to lock the pluggable electronic module 12 within the receptacle assembly 14.

The lever 80 extends from the top of the upper shell 68. A tether 140 extends forward from the handle 122. The tether 140 may be pulled forward to actuate the lever 80.

The yoke insert 112 is coupled to the yoke body 110. In an exemplary embodiment, a tab 142 extends from the yoke insert 112 to secure the yoke insert 112 to the yoke body 110. The yoke insert 112 extends rearward to the latch end 84. The latch end 84 is received within the slot 130 of the latch element 86. In an exemplary embodiment, the latch end 84 is curved and the walls defining the slot 130 are planar. As the yoke insert 112 is rotated, the latch end 84 rotates along one or more of the walls defining the slot 130.

When the latch assembly 18 is in the mated state, such as in the position illustrated in FIG. 7, the lever 80 and the yoke assembly 82 are in a latched position. The yoke assembly 82 extends generally parallel to the bottom 92 in the latched position. The lever 80 extends generally perpendicular to the bottom 92 in the latched position.

In the mated state, the latch element 86 is in an engaged position. In the engaged position, the latching end 102 of the latch element 86 extends beyond the bottom 92 and engages the latch element 42. For example, the latching end 102 extends into the opening 46 of the latch element 42. A latching surface 144 of the latch element 86 engages a portion of the latch element 42 to resist removal of the pluggable electronic module 12 from the receptacle assembly 14. The latch element 86 also includes a ramp surface 146 opposite to the latching surface 144. As the pluggable electronic module 12 is mated with receptacle assembly 14, the ramp surface 146 engages the ramp surface 48 of the latch element 42. The ramp surface 48 generally forces the latch element 86 upward into the channel 100. When the latch element 86 is aligned with the opening 46, the return spring 128 forces the latch element 86 downward or outward into the opening 46.

Figure 8:
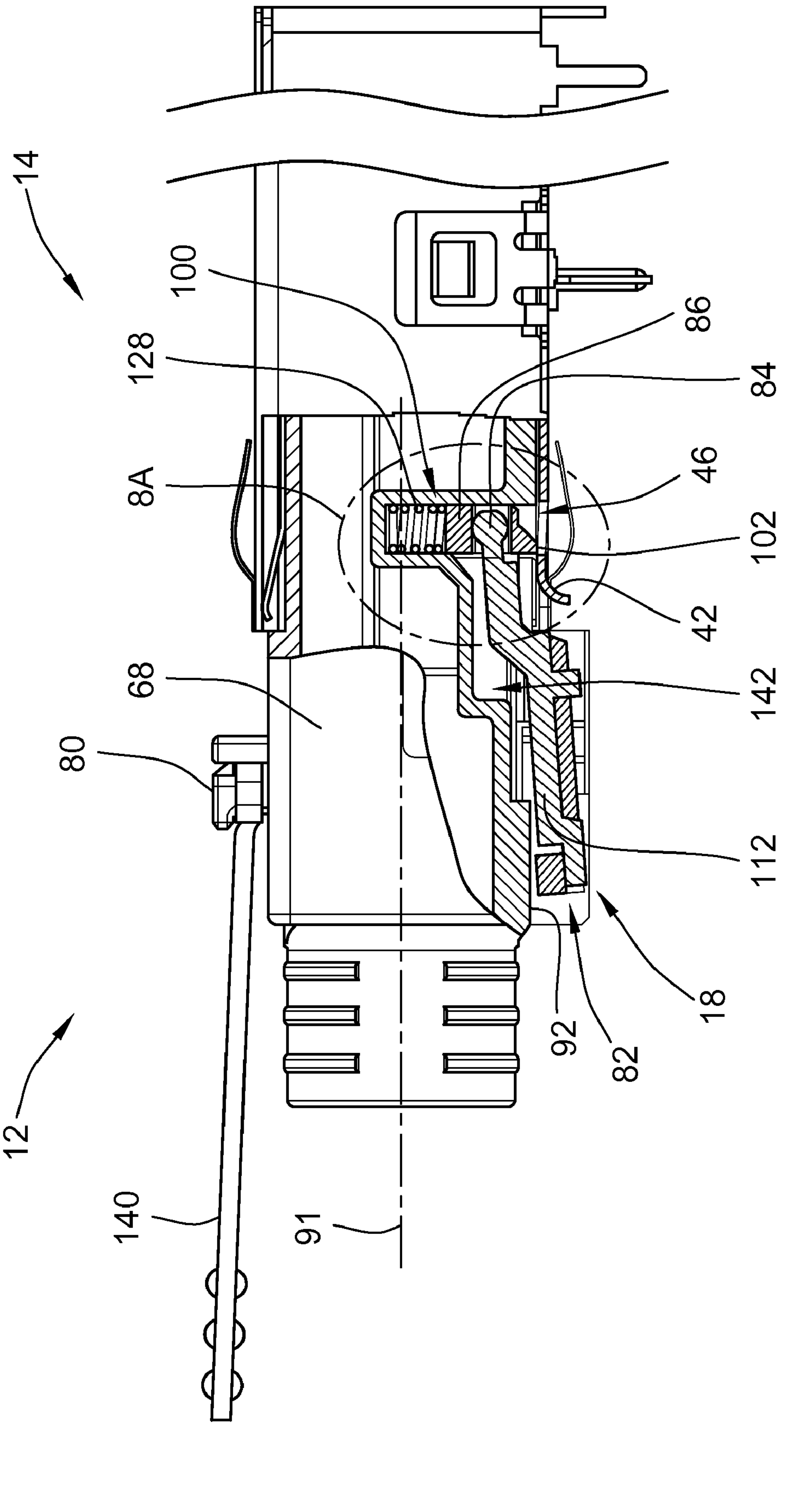
FIG. 8 is a partial sectional view of the pluggable electronic module with the latch assembly in a retracted state.

FIG. 8 is a partial sectional view of the pluggable electronic module 12 with the latch assembly 18 in a retracted state. The latch assembly 18 is moved to the retracted state by pulling the lever 80 forward. The lever 80 and yoke assembly 82 are rotated from the latched position (shown in FIG. 7) to an unlatched position, such as the position illustrated in FIG. 8. In the unlatched position, the lever 80 is oriented non-perpendicular to the housing axis 91. In the unlatched position, the yoke assembly 82 is oriented non-parallel to the bottom 92. However, the lever 80 and yoke assembly 82 may be moved to any angle in the latched position and the unlatched position depending in other embodiments. The housing 64 includes a cavity 148 open inward from the bottom 92 and accommodates the yoke assembly 82 when the yoke assembly 82 is rotated to the unlatched position.

When the yoke assembly 82 is rotated to the unlatched position, the yoke insert 112 lifts the latch element 86 to an unengaged positions such as the position illustrated in FIG. 8. In the unengaged position, the latching end 102 is removed from the opening 46 of the latch element 42. The latching surface 144 is no longer aligned with the latch element 42.

Figure 9:
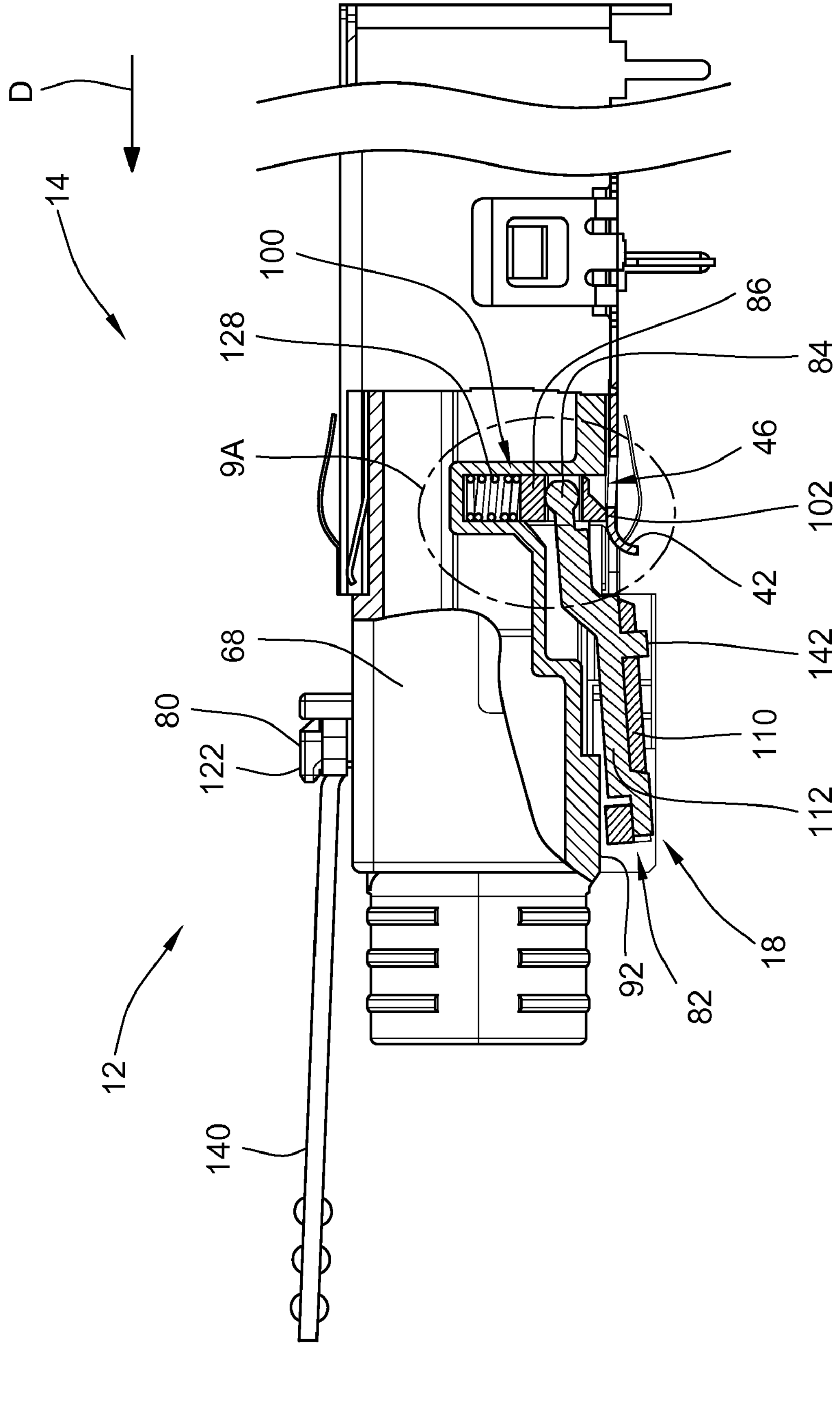
FIG. 9 is a partial sectional view of the pluggable electronic module with the latch assembly in a disengaged state.

FIG. 9 is a partial sectional view of the pluggable electronic module 12 with the latch assembly 18 in a disengaged state. The pluggable electronic module 12 is moved to the disengaged state by pulling the lever 80 and/or the housing 64 forward away from the receptacle assembly 14, such as in the direction of arrow D. Because the latch element 86 is in the unengaged position, the pluggable electronic module 12 is capable of being removed from the receptacle assembly 14. Once the latch element 86 clears the ramp surface 48 of the latch element 42, the latch element 86 may be returned to the outward position and the yoke assembly 82 may be returned to the latched position.

The lever 80 and yoke assembly 82 cooperate to release the pluggable electronic module 12 from the receptacle assembly 14 in a cost effective and reliable manner. The connection between the lever 80 and the yoke assembly 82 is a simple connection and movement of the lever 80 is simply converted into movement of the yoke assembly 82. For example, pulling the lever 80 causes rotation of the yoke assembly 82 about the pivot axis 90. Such an interface between the lever 80 and yoke assembly 82 causes simpler movement than other configurations, such as sliding configurations. The return spring 128 operates to ensure that the latch element 86 locks the pluggable electronic module 12 to the receptacle assembly 14.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A latch assembly for a pluggable electronic module matable with a receptacle assembly, the latch assembly comprising:

a lever actuatable between a latched position and an unlatched position;

a yoke assembly operatively coupled to the lever, the yoke assembly having a latch end rotatable between a latched position and an unlatched position; and a latch element coupled to the latch, end of the yoke assembly, the latch element movable between an engaged position and an unengaged position as the latch end is rotated between the latched and unlatched positions, respectively, the latch element being configured to engage the receptacle assembly to lock the pluggable electronic module within the receptacle assembly when the latch element is in the engaged position; and a return spring configured to be held within the pluggable electronic module, the return spring engaging the latch element and urging the latch element to the engaged position.

2. The latch assembly of claim 1, wherein the yoke assembly is one of fixedly coupled to the lever and integrally formed with the lever.

3. The latch assembly of claim 1, wherein the latch element is movable in a linear direction, the latch end being rotatable with respect to the latch element.

4. The latch assembly of claim 1, further comprising a rotator pin extending from at least one of the lever and the yoke assembly, the rotator pin being configured to engage a housing of the pluggable electronic module, the lever and the yoke assembly rotating about the rotator pin.

5. The latch assembly of claim 1, wherein the yoke assembly includes a yoke body coupled to the lever and the yoke assembly includes a yoke insert coupled to the yoke body, the yoke insert extending from the yoke body to the latch end to engage the latch element.

6. The latch assembly of claim 1, wherein the latch element extends along a latch axis between opposed ends, one of the ends engaging the receptacle assembly, the latch element being movable along the latch axis, the latch element having a slot extending along the latch axis, a portion of the yoke assembly being received within the slot.

7. A pluggable electronic module comprising:

a housing configured to be received within a receptacle assembly;

an electronic component held by the housing and configured to be mated with a connector of the receptacle assembly; and a latch assembly configured to lock the housing within the receptacle assembly, the latch assembly comprising a lever movably coupled to the housing and a yoke assembly operatively coupled to the lever, the lever and yoke assembly rotatable between a latched position and an unlatched position, the latch assembly further comprising a latch element coupled to the yoke assembly, the latch element extending along a latch axis between opposed ends, one of the ends configured to engage the receptacle assembly, the latch element movable by the yoke assembly in a linear direction along the latch axis between an engaged position and an unengaged position as the yoke assembly is rotated between the latched and unlatched positions, respectively, the latch element being configured to lock the housing within the receptacle assembly when in the engaged position.

8. The module of claim 7, wherein the housing includes an upper shell and a lower shell, the latch assembly includes a rotator pin captured between the upper and lower shells, the lever and yoke assembly being rotatable about the rotator pin.

9. The module of claim 7, wherein the housing includes a top and a bottom, the lever extending from the top, the yoke assembly positioned along the bottom, the latch element extending from the bottom when in the latched position.

10. The module of claim 7, wherein the housing includes a channel formed therein, the latch element being received within and being movable within the channel.

11. The module of claim 7, wherein the housing includes a top and a bottom, the lever extending from the top, the latch element being movable generally perpendicular to the bottom, the yoke assembly being rotatable with respect to the bottom.

12. The module of claim 7, further comprising a tether coupled to the lever, the tether being pulled to actuate the lever.

13. The module of claim 7, wherein the yoke assembly has a pivot axis, the yoke assembly being fixed relative to the housing about the pivot axis, the yoke assembly being rotated relative to the housing about the pivot axis.

14. A pluggable electronic module comprising:

a housing configured to be received within a receptacle assembly;

an electronic component held by the housing and configured to be mated with a connector of the receptacle assembly; and a latch assembly configured to lock the housing within the receptacle assembly, the latch assembly comprising a lever movably coupled to the housing and a yoke assembly operatively coupled to the lever, the latch assembly further comprising a latch element coupled to the yoke assembly and a return spring engaging the latch element, the latch element movable between an engaged position and an unengaged position, the yoke assembly forcing the latch element to the unengaged position when the lever is actuated and the return spring forcing the latch element to the engaged position when the lever is released.

15. The module of claim 14, wherein the housing includes a channel formed therein, the latch element and the return spring being received within the channel, the return spring forcing the latch element at least partially out of the channel when the lever is released.

16. The module of claim 14, wherein the housing includes a top and a bottom, the lever extending from the top, the latch element being movable generally perpendicular to the bottom, the yoke assembly being rotatable with respect to the bottom.

17. The module of claim 14, wherein the latch element extends along a latch axis between a spring end and a latching end, the return spring engaging the spring end, the latching end being configured to engage the receptacle assembly when in the engaged position, the latch element being movable in the direction parallel to the latch axis.

18. The module of claim 14, further comprising a rotator pin extending from at least one of the lever and the yoke assembly, the rotator pin being configured to engage the housing, the lever and the yoke assembly rotating about the rotator pin.

19. The module of claim 14, wherein the yoke assembly includes a yoke body coupled to the lever and the yoke assembly includes a yoke insert coupled to the yoke body, the yoke insert extending from the yoke body to the latch end to engage the latch element.

20. The module of claim 7, further comprising a return spring held within the housing, the return spring engaging the latch element and urging the latch element to the engaged position.

21. The module of claim 7, wherein the latch element includes a slot extending along the latch axis, a portion of the yoke assembly being received in the slot.

* * * * *